United States Patent [19]
Johnson

[11] Patent Number: 5,297,092
[45] Date of Patent: Mar. 22, 1994

[54] SENSE AMP FOR BIT LINE SENSING AND DATA LATCHING

[75] Inventor: Larry D. Johnson, San Jose, Calif.

[73] Assignee: Mips Computer Systems, Inc., Sunnyvale, Calif.

[21] Appl. No.: 892,918

[22] Filed: Jun. 3, 1992

[51] Int. Cl.[5] .................. H03K 17/16; G11C 11/409
[52] U.S. Cl. ........................... 365/203; 307/530; 365/190; 365/196
[58] Field of Search .......... 365/203, 190, 196; 307/530

[56] References Cited

U.S. PATENT DOCUMENTS

| | | |
|---|---|---|
| 4,612,631 | 9/1986 | Ochii . |
| 4,701,889 | 10/1987 | Ando . |
| 4,758,995 | 7/1988 | Sato . |
| 4,771,405 | 9/1988 | Burch et al. . |
| 4,804,871 | 2/1989 | Walters, Jr. .................. 365/190 |
| 4,922,461 | 5/1990 | Hayakawa . |
| 5,202,854 | 4/1993 | Koike ............................ 365/203 |

FOREIGN PATENT DOCUMENTS 2-62785  3/1990  Japan .

*Primary Examiner*—Eugene R. LaRoche
*Assistant Examiner*—Viet Q. Nguyen
*Attorney, Agent, or Firm*—Townsend & Townsend Khourie and Crew

[57] ABSTRACT

A sense amp and latch for sensing and latching data on a plurality of bit and inverse bit lines is provided. A sense amp power line which connects the sense amp to a ground line also decouples the bit lines from the sense amp during the evaluation process. The circuit allows for automatic latching of the data which the sense amp evaluated without requiring the generation of other timing signals. Capacitive loading on each of the two sides of the sense amp are equal.

12 Claims, 3 Drawing Sheets

FIG. 1
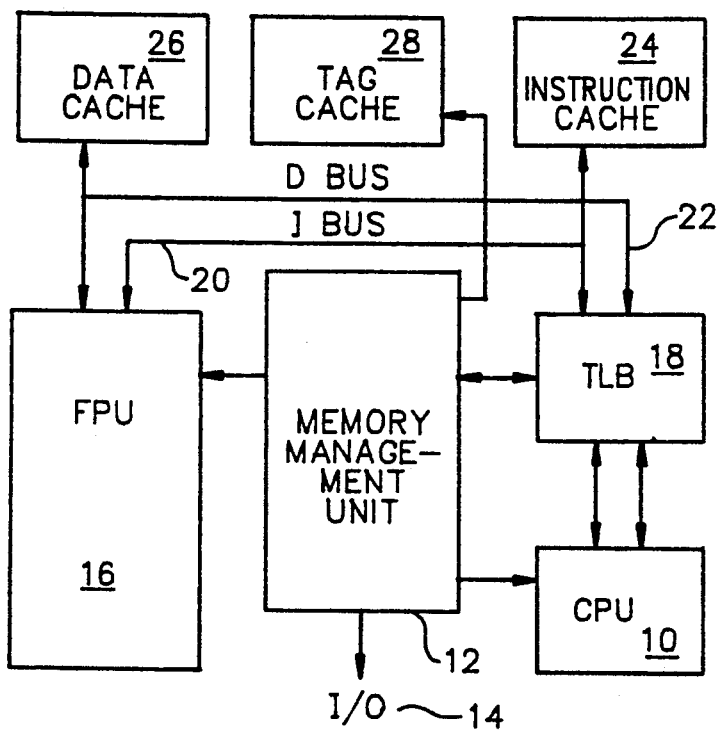
FIG. 4
FIG. 4A
$\overline{PC}$
FIG. 4B
SAP
FIG. 4C
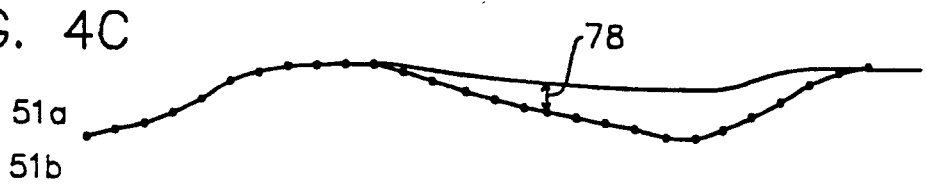
51a
51b
FIG. 4D
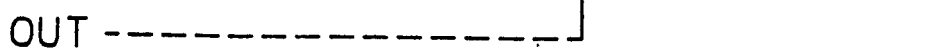
OUT

SENSE AMP FOR BIT LINE SENSING AND DATA LATCHING

The present invention relates to a computer memory sense amp and in particular to a differential sense amp and output latch.

BACKGROUND OF THE INVENTION

It is well known to use sense amplifiers for evaluating and outputting the binary status of bit lines from a memory device. However, the design of such sense amps becomes critical in certain types of specialized memory such as cache memory. In memories which have a particularly small cycle time, the creation of precise timing signals is difficult. In a pre-charged type sense amp, the sense amp typically must be powered up for evaluation of the bit lines and must be powered down for pre-charging before the next evaluation. Capturing the data which the sense amp has evaluated, before the next pre-charge time, is difficult. Previous designs have solved this problem by providing a separate clock or enable signal to a latch. The timing for the latch-enable further complicates the overall timing design for the memory system.

In the context of ordinary static-type memory circuits, U.S. Pat. No. 4,612,631 issued Sep. 16, 1986 to Ochii discloses a memory circuit having sense amps and a data holding circuit which includes cross-coupled NAND gates. Because these gates are coupled directly to the bit lines, a relatively large load is placed on the sense amps, slowing their evaluation. In this type of circuit, the bit lines must be driven "full swing" (i.e., between the voltage normally taken as indicating a logical zero and the voltage, normally taken as indicating a logical one which will typically be Vcc-Vss, or about five volts). Driving the bit lines at full swing is particularly power-consumptive, especially where a large number of lines must be driven, as well as time consuming. Although this approach may be acceptable in some contexts, when a small-cycle-time memory circuit is necessary, the RC delay is unacceptable.

In the context of a dynamic random access memory, U.S. Pat. No. 4,758,995, issued Jul. 19, 1988 to Sato discloses first and second amplifying circuits which have a fully differential amplifier construction. Although the amplifier shown therein may be effective for some applications, when it is desired to minimize current consumption, for example, when a large number, such as 256, bit lines are to be sensed, an undesirably and unnecessarily large amount of power would be consumed.

SUMMARY OF THE INVENTION

According to the present invention, a differential sense amplifier is provided which is connected to an output latch and to the bit lines in such a way that the when the sense amp power is supplied, and one side of the amp is permitted to discharge, the bit lines are uncoupled from the amplifier. The circuit allows for the automatic latching of data when the sense amp is evaluated without requiring the generation of other timing signals such as a latch-enable signal. In the preferred embodiment of the invention, the bit line and inverted bit line are input to the differential sense amplifier via MOSFET transistors controlled by the sense amp power line. The sense amp power line also controls the transistor which connects the differential sense amp to the discharge line.

The circuit also provides for equal capacitive loading of the two sides of the sense amp. The sense amp provides gain for the evaluation of the state of the bit and inverted bit lines. In addition, the latch provides some amount of gain for the evaluation of the sense amp.

BRIEF DESCRIPTION OF THE DRAWINGS

FIG. 1 is a block diagram of a microprocessor showing one potential application of the present invention;

FIG. 4A-4D are schematic timing diagrams of signals used in the present invention.

DETAILED DESCRIPTION OF THE PREFERRED EMBODIMENTS

Figure 2:
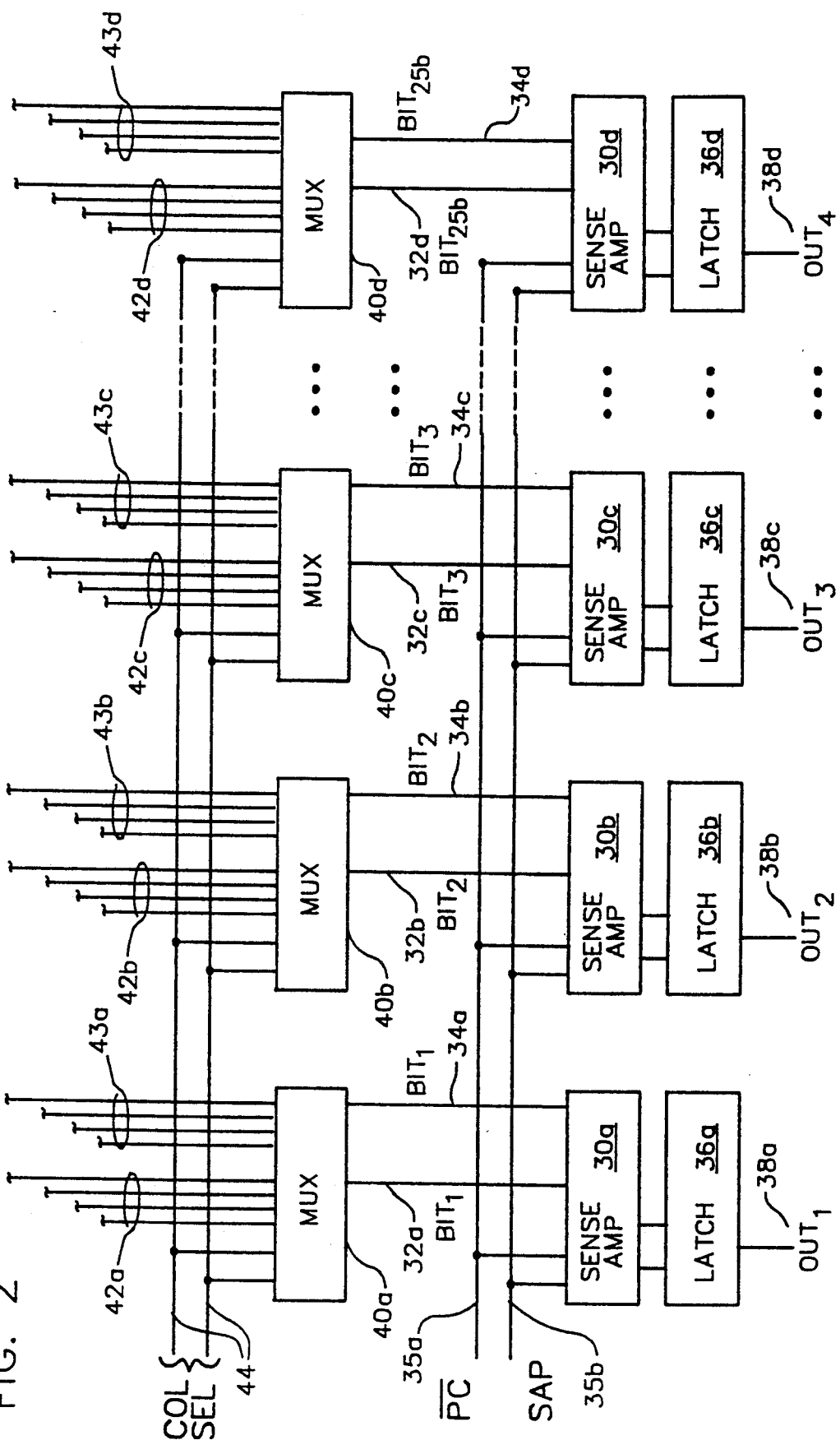
FIG. 2 is a block diagram showing the relationship of the sense amp and latch of the present invention to multiplexed bit line inputs in the context of a 256-bit input.

Although the present invention can be used in connection with a number of types of memory systems, it has particular use in the context of a cache system for inclusion in a microprocessor. As depicted in FIG. 1, one embodiment of a microprocessor is built around a CPU 10 which is connected to a memory management unit 12 providing for microprocessor I/O 14 and communicates with a floating point unit 16 (FPU) and a translation lookaside buffer 18 (TLB) which also communicates directly with the CPU 10. The TLB 18 and the FPU 16 are connected by an instruction bus 20 and a data bus 22. The instruction bus 20 communicates with an instruction cache 24 and the data bus 22 communicates with a data cache 26. The memory management unit 12 communicates with a tag cache 28. The operation of all of these items are well known in the art.

The instruction cache 24, data cache 26, and tag cache 28 are specialized memory devices which have short cycle times and wide inputs and outputs. For these reasons, it is particularly important in applications such as those depicted in FIG. 1 that the memories have low per bit power consumption and small drivers to minimize RC delay and current consumption. In the instruction cache 24, data cache 26, and tag cache 28, as in other types of memory, data which is output from the memory cells on bit lines must be evaluated and output. This is typically done by a sense amplifier.

As depicted in FIG. 2, differential sense amplifiers 30a-d, receive signals on bit lines 32a-d and the inverted signal on an inverted bit line 34a-d. In one embodiment, the level on the bit lines is about ±50 mV. The sense amps 30a-30d evaluate the logic levels on the bit lines 32a-32d and inverted lines 34a-34d by amplifying the difference between the lines and outputting the evaluated signals to latches 36a-36d to provide output signals 38a-38d. The sense amps 30a-30d are pre-charged amps in which the pre-charge is controlled by a pre-charge line 35a and evaluation is initiated by a sense amp power signal 35b. Although only four sets of bit and inverted bit lines and sense amplifiers are depicted in FIG. 2, in one embodiment of the present invention, 256 bit-lines are evaluated at once. Because such a large number of bit lines are evaluated at once, it is important to minimize current and power consumption, as described above. According to one embodiment of the invention, the bit lines 32a-32d and inverted bit lines 34a-34d are output by multiplexors 40a-40d which each select among four column bit lines 42a-42d and 4 column bit bar lines (inverted column bit lines) 43a-43d under the control of column select lines 44.

Figure 3:
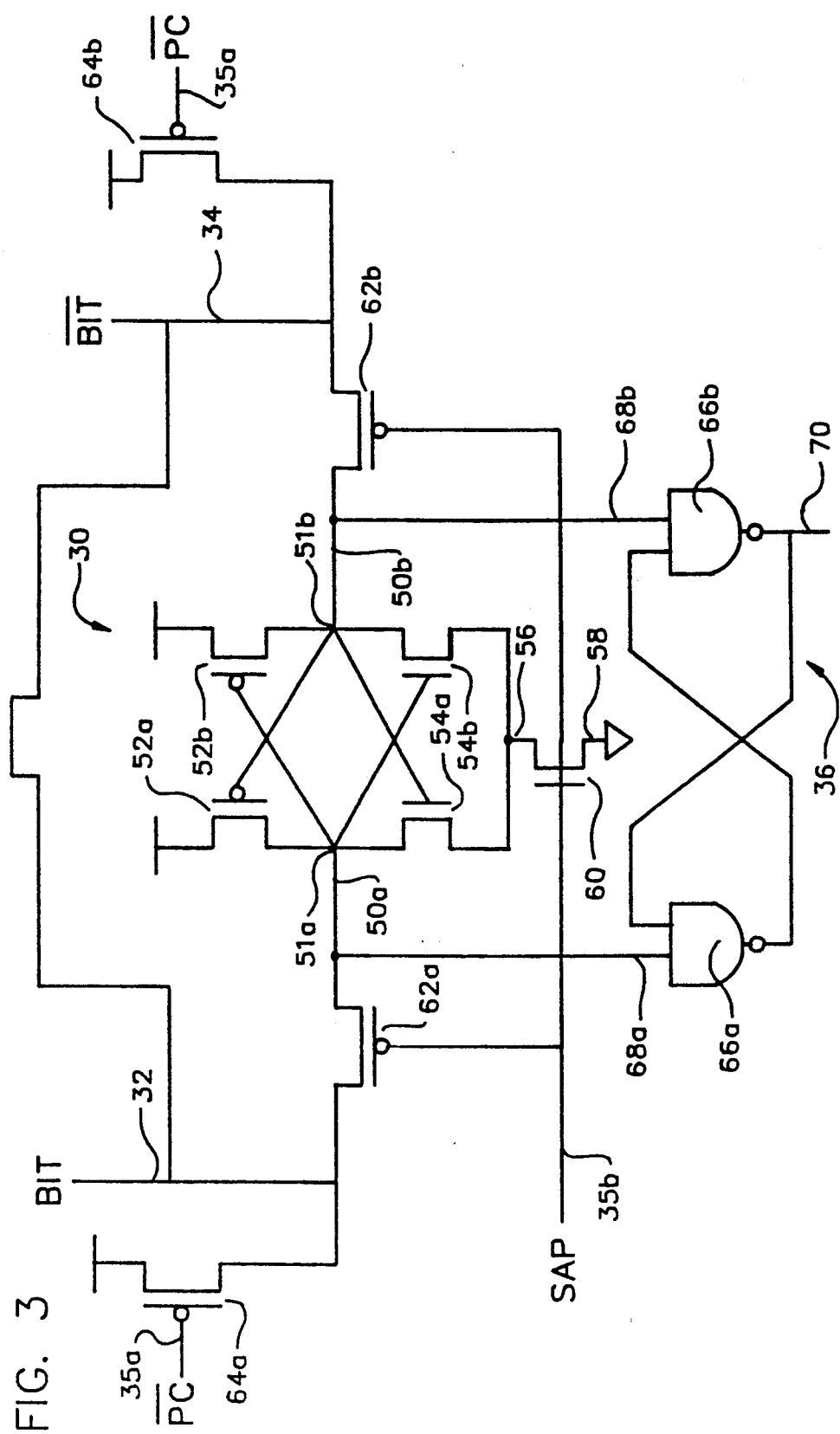
FIG. 3 is a schematic diagram showing a sense amp and latch according to an embodiment of the present invention.

FIG. 3 depicts a sense amp 30 and latch 36 according to one embodiment of the present invention. The sense amp 30 includes two input lines 50a, 50b. Node 51a between the series-connected MOSFETs 52a, 54a, is connected to the gates of transistors 52b, 54b. Node 51b between the series-connected MOSFETS 52b, 54b is connected to the gates of transistors 52a and 54a. The node 56 which connects transistors 54a and 54b leads to a ground line 58 controlled by a transistor 60. Input line 50a is connected, via MOSFET 62a to bit line 32 and to a charge line controlled by a pre-charge control line 35a via transistor 64a. Input line 50b is connected, via MOSFET 62b to inverted bit line 34 and a charge line controlled by pre-charge line 35a via transistor 64b. The gates of transistors 62a, 62b, and 60 are connected to the sense amp power (SAP) line 35b.

Latch 36 includes cross-coupled NAND gates 66a, 66b with two input lines 68a, 68a, and a single output line 70. The first latch input line 68a is coupled to the sense amp node 51a. The latch input line 68a is attached to the sense amp node 51b.

FIGS. 4A-D depict the relative timing of a number of signals in the device shown in FIG. 3. FIGS. 4A-4D depict the relationship of signals according to one embodiment of the invention and the horizontal axis is not necessarily to scale. In the initial part of a bit line evaluation cycle, the $\overline{PC}$ lines 35a are driven low 72. This causes both the left and right sides of the sense amp 30 to begin charging and equalizing. The charge on the two sides of the sense amp are represented in FIG. 4C by the voltage at nodes 51a (shown by a solid line) and 51b (shown by a dotted line). In the example shown in FIG. 4, the output from the bit line being sensed is a logical "one". After the pre-charge has been initiated, the nodes 51a and 51b become substantially pre-charged, as shown in FIG. 4C.

After the bit line provides an output, the sense amp power line (SAP) becomes high 76, as shown in FIG. 4B. This initiates the evaluation process. As noted above, when the SAP line 35b becomes high 76, transistors 62a and 62b become substantially non-conducting and, substantially simultaneously, transistor 60 connects node 56 to the ground line 58. Because transistors 62a and 62b are substantially non-conducting, the bit lines are not directly coupled to the sense amp 30 and latch 36 during the latching process. Because sense amp 30 is effectively cut off from the bit lines, no charging of the bit lines will occur. Thus, the sense amp 30 is exposed to a much lower capacitance than it otherwise would be, and thus evaluates more quickly.

When voltage is sent down the SAP line, gain is obtained from the cross-coupled inverters (54a, 54b, 52a, 52b). A relatively large amount of current is required when the differential sense amp is beginning to "flip" to one or the other asymmetric configuration. Providing signals from the bit lines directly to the differential sense amp during this process, as was done in certain previous designs, results in unwanted RC delay. As can be seen, in the present invention, it is necessary to drive only a relatively small load during this period. In this way, it is possible to avoid having to drive the bit lines "full swing."

As seem in FIG. 4C, node 51a once charged, retains substantially the same voltage, (with perhaps a slight decrease due to leakage). When the difference in voltage between the two nodes 51a, 51b reaches a sufficient value 78, for example, 100 mV, then SAP goes high, after which the sense amp evaluates that the bit line 32 was in a logical "1" state. The output latch 36 then retains this evaluation. It is not necessary that node 51b be discharged "full swing". Node 51b only needs to decrease to a level sufficient to cause the cross-coupled NAND gates 66a, 66b to roll over. Thus, there is "gain" produced by the latch 36 coupled to the sense amp 30.

The capacitance presented to nodes 51a, 51b by the latch 36 is substantially equal at the two nodes 51a, 51b. The provision of equal capacitance on the two sides of the sense amp 30 is important, particularly in cases where only a small difference, such as about 100 mV is being sensed. For example, it is possible that a power surge could occur at the time when the latch 36 is responding to voltages at the nodes 51a, 51b. If there were a different capacitance presented at the two nodes 51a, 51b then, in response to the power surge, it is possible that node 51a, might decrease by, e.g., 200 mV while node 51b might decrease by e.g., 100 mV. This would make the voltage on the two nodes 51a, 51b substantially not equal and the output 70 from the latch 36 would not necessarily correspond to the input on the bit and inverse bit lines 32, 34.

In light of the above description, a number of advantages of the present invention can be seen. The invention permits simultaneous evaluation of a large number of bit lines such as 256 bit lines, while minimizing current consumption and RC delay. The data on the bit lines evaluated by the sense amp is automatically latched without requiring the generation of other timing signals to effect the latching. Gain is provided for the sense amp and the capacitive loading on each of the two sides of the sense amp is equal. The bit lines are insulated from the sense amp during evaluation and latching and the bit lines do not have to be driven full swing. Since each of the two sides of the sense amp are high after pre-charging, the data is guaranteed to stay valid on the output of the sense amp due to the cross coupled NAND gates.

A number of variations and modifications of the present invention can also be used. Although the sense amp depicted in FIG. 3 is preferred, the present invention can be used in connection with a number of different pre-charged differential sense amps. Although FIG. 2 depicts simultaneous evaluation of 256 bit lines, the present invention can be used with more or fewer bit lines and can be used by obtaining bit input from sources other than the multiplexors 40. Although one use for the invention is in the data cache, tag cache and instruction cache depicted in FIG. 1, the invention can be used in other contexts where evaluation of the binary values on a number of bit lines is desired.

Although the present invention has been described by way of a preferred embodiment and certain variations and modification, other variations and modifications can also be used, the invention being described by the following claims.

What is claimed is:

1. In a memory device which outputs binary signals on a plurality of bit and inverse bit lines, a sense amplifier for determining the binary state of said bit and inverse bit lines and outputting a signal indicating the sensed binary state, comprising:

amplifier means for receiving a first, pre-charge signal and for receiving a second signal from said bit line and a third signal from said inverse bit line which is the inverse of said second signal, said amplifier means including first and second means for retaining said pre-charge signal;

means for
selectively discharging one of said first and second means, depending on the binary state of said second and third signals and
uncoupling said bit line and inverse bit line from said amplifier means;

latching means for outputting latch output signals based on the state of said amplifier means, said latch output signals including a first signal when said first means is the means which is discharged and outputting a second signal when said second means is the means which is discharged, said outputting occurring before said one of said first and second means is fully discharged, and after said bit and inverse bit lines are uncoupled from said amplifier means wherein said latching means is perpetually enabled, such that either said first or second signals may be output without the need for first receiving an enablement signal.

2. A sense amplifier, as claimed in claim 1, wherein said means for selectively discharging and for uncoupling includes transistor means wherein said means for latching includes first and second input lines coupled between said transistor means and said amplifier means.

3. A sense amplifier, as claimed in claim 2, wherein said amplifier means receives said pre-charge signal from first and second pre-charge lines and wherein said transistor means are also coupled between said amplifier means and said pre-charge lines.

4. A sense amplifier for receiving signals on a bit line and an inverse bit line and outputting a status signal indicating the status of said bit and inverse bit lines, comprising:
a pre-charged, differential sense amplifier having first and second amplifier input lines and a discharge line selectively coupled to ground by a first transistor;
first and second pre-charge lines;
said first input line selectively coupled to said bit line and said first pre-charge line by a second transistor;
said second input line selectively coupled to said inverse bit line and said second pre-charge line by a third transistor;
an output latch having first and second latch input lines and an output line for outputting said status signal, based on the state of said amplifier, said first latch input line coupled to said first amplifier input line between said second transistor and said amplifier, said second input line coupled to said second amplifier input line between said third transistor and said amplifier, wherein said output latch is perpetually enabled, such that said status signal may be output without the need for first receiving an enablement signal; and
a sense amp power line configured to place said first transistor in a conductive state and said second and third transistors in a nonconductive state.

5. A sense amplifier, as claimed in claim 4, wherein said first and second amplifier input lines have substantially equal capacitive loads.

6. In a memory device which outputs binary signals on a plurality of bit lines, said memory device having a differential sense amplifier, a method for determining the binary state of bit and inverse bit lines and outputting a signal indicating the sensed binary state, comprising:
receiving a first, pre-charge signal;
receiving a second signal from said bit line and a third signal from said inverse bit line which is the inverse of said second signal,
storing said pre-charge signal in first and second storage means in said amplifier;
selectively discharging one of said first and second storage means, depending on the state of said second and third signals and
uncoupling said bit line and inverse bit line from said amplifier means;
outputting latch output signals based on the state of said amplifier means, said latch output signals including a first signal which is output when said first storage means is the means which is discharged and a second signal which is output when said second storage means is the means which is discharged, said outputting occurring before said first and second storage means are fully discharged, and after said bit and inverse bit lines are uncoupled from said amplifier means.

7. A sense amplifier, as claimed in claim 1, wherein said latching means includes means for effectuating gain when either said first or second means is discharged.

8. A sense amplifier, as claimed in claim 1, wherein said latching means comprises:
a first NAND gate having a first input coupled to said first means;
a second NAND gate having a first input coupled to said second means;
said first NAND gate further having a second input coupled to the output of said second NAND gate; and
said second NAND gate further having a second input coupled to the output of said first NAND gate, the output of said second NAND gate outputting said first and second signals.

9. A sense amplifier, as claimed in claim 4, wherein said output latch is selected to provide gain between said first and second latch input lines and said output line.

10. A sense amplifier, as claimed in claim 4, wherein said output latch comprises:
a first NAND gate having a first input coupled to said first latch input line and a second input coupled to said output line; and
a second NAND gate having a first input coupled to said second latch input line and a second input coupled to the output of said first NAND gate, the output of said second NAND gate outputting said output line.

11. A method as claimed in claim 6 wherein said step of outputting is carried out by an output latch wherein said output latch is perpetually enabled, such that said step of outputting may be accomplished without the need for first receiving an enablement signal.

12. The method as claimed in claim 6 wherein said step of outputting is carried out by an output latch wherein said output latch is perpetually enabled, such that said step of outputting may be accomplished without the need for first receiving an enablement signal, said output latch further comprising a pair of cross coupled NAND gates.

* * * * *